United States Patent [19]
Martin

[11] Patent Number: 5,418,497
[45] Date of Patent: May 23, 1995

[54] LOW VOLTAGE VCO HAVING TWO OSCILLATOR CIRCUITS OF DIFFERENT FREQUENCIES

[75] Inventor: Frederick L. Martin, Plantation, Fla.

[73] Assignee: Motorola, Inc., Schaumburg, Ill.

[21] Appl. No.: 270,624

[22] Filed: Jul. 5, 1994

[51] Int. Cl.[6] .............................................. H03B 5/12
[52] U.S. Cl. ....................... 331/48; 331/52; 331/117 R; 331/167; 331/177 R; 331/185
[58] Field of Search .................. 331/47, 48, 52, 56, 331/117 R, 117 FE, 168, 167, 177 R, 185, 186

[56] References Cited

U.S. PATENT DOCUMENTS 4,660,000  4/1987  Kleinberg .................. 331/117 R X

OTHER PUBLICATIONS

IEEE Journal of Solid State Circuits, vol. 27, No. 3, Mar. 1992 "A 1.8-GHz Monolithic LC Voltage Controlled Oscillator", pp. 444–450. Nguyen et al.

*Primary Examiner*—Siegfried H. Grimm
*Attorney, Agent, or Firm*—M. Mansour Ghomeshi

[57] ABSTRACT

BiCMOS technology is used in the design of a VCO (200) to improve low DC operation. The VCO (200) includes two coupled oscillator circuits (201,219) tuned to different fixed frequencies such that the oscillator resonant frequencies define the tuning range of the VCO (200). The oscillator circuits (201, 219) are coupled such that the frequency of oscillation of the VCO (200) is adjustable via variable resistors (206, 214) by manipulating the bias currents to the two oscillator circuits (201,219). A biasing circuit (208) along with variable resistors (206 and 214) provide the DC bias to the oscillator circuits (201 and 219). The biasing circuit (208) maintains the sum of the biasing currents to the oscillator circuits constant. The oscillator circuits (201, and 219) are interconnected utilizing an RF coupling circuit (211). The VCO (200) is capable of operating at voltages as low as 1.8 volts DC.

16 Claims, 6 Drawing Sheets

LOW VOLTAGE VCO HAVING TWO OSCILLATOR CIRCUITS OF DIFFERENT FREQUENCIES

TECHNICAL FIELD

This invention is generally related to oscillators and more particularly to Voltage Controlled Oscillators (VCO).

BACKGROUND

Voltage Controlled Oscillators (VCOs) constructed of resonant circuits are used in communication devices as the means of generating a desired frequency of operation. Recent VCO designs don't use varactors which were the traditional means of tuning oscillators. The elimination of varactors in VCOs results in significant benefits in monolithic applications were an entire circuit is realized on a single Integrated Circuit (IC). One such design is shown in FIG. I and fully described in an article titled "A 1.8 GHz Monolithic LC Voltage Controlled Oscillator" written by Nyugen and Meyer and published in the IEEE Journal of Solid State Circuits. VOL. 27, No. 3, March 1992.

Referring to FIG. 1, it can be seen that this design includes a tunable oscillator constructed without varactors from a Gilbert multiplier cell and two tank circuits. Bipolar transistors and current sources comprise the Gilbert cell. A problem with this design architecture is its limitation at low supply voltages. There are two factors that prevent effective operation at low DC voltages. First, it is necessary to bias transistors 102–112 such that operation outside of the saturation region is maintained. The current source 114 is typically constructed of a bipolar transistor and thus requires a similar restriction. A typical set of bias conditions is shown in FIG. 1. The tuning lines at the base of transistors 102–108 are assumed to be 1.7 V and $V_{BE}$ is 0.9 V. Under this set of conditions the voltages at the base nodes of transistors 110 and 112 are at a steady state value of 1.2 V while the collectors are at 0.8 V. Assuming a collector-emitter saturation voltage of 0.3 V, an AC signal of only 0.2 V applied to the bases of transistors 110 and 112 would place the devices in saturation. Similarly, transistors 102 and 108 are driven into saturation by a 0.7 $V_{AC}$ signals applied to their collectors.

A second problem with the circuit of prior art is that the tuning voltage is restricted to the range of approximately ±0.2 V. This is a result of the differential-pair structures which control the tuning operation. A low tuning voltage range results in high sensitivity to noise at the tuning ports 101 and 109 which results in poor noise performance of the oscillator. The typical method for increasing the linear range of a differential amplifier, adding resistance in the emitter branches of the circuit, can not be applied in low voltage circuits because it exacerbates the problem with device saturation.

These problems prevent the effective use of this circuit in portable radio applications which operate using batteries. It is desired to have a "varactorless" VCO that overcomes the deficiencies of the prior art.

DETAILED DESCRIPTION OF THE PREFERRED EMBODIMENT

Oscillators that may be tuned without the use of a varactor are highly desired chiefly because varactors with high quality factor are difficult to realize on monolithic IC processes. The quality factor of a varactor (ratio of reactance to resistance) is poor at high frequencies which results in an increase in the VCO sideband noise. A problem with existing LC oscillators is their inability to perform at low supply voltages. At the present time, there are "varactorless" VCOs i.e., RC oscillators, that perform their intended function without utilizing any inductors. RC oscillators have poor noise performance. The present invention provides an LC Voltage Controlled Oscillator that is capable of operating at supply voltages as low as 1.8 volts DC. The principles of this invention would be better understood by referring to a series of drawings in which like numbers are carried forward.

Figure 1:
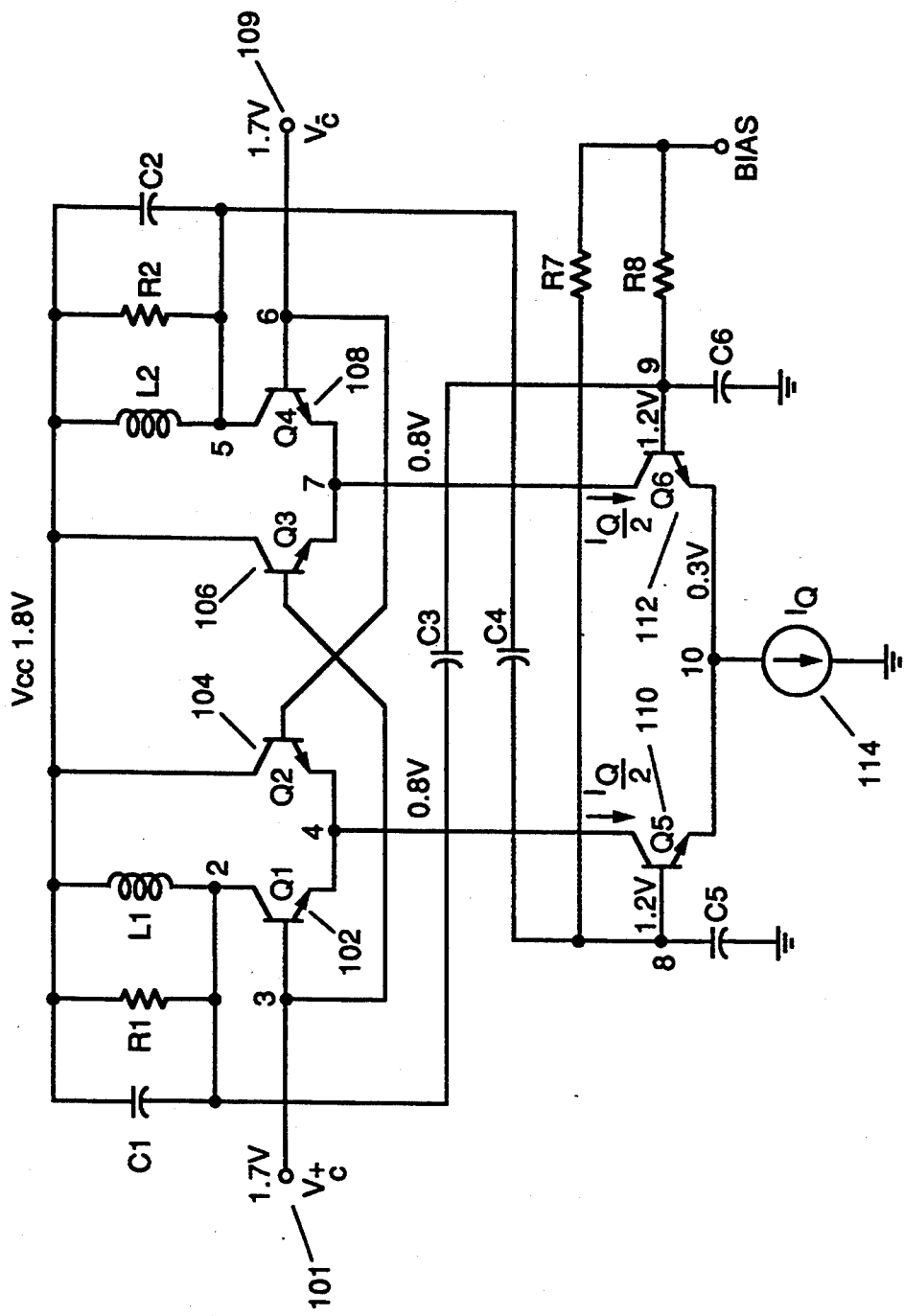
FIG. 1 shows a voltage controlled oscillator presently available.
Figure 2:
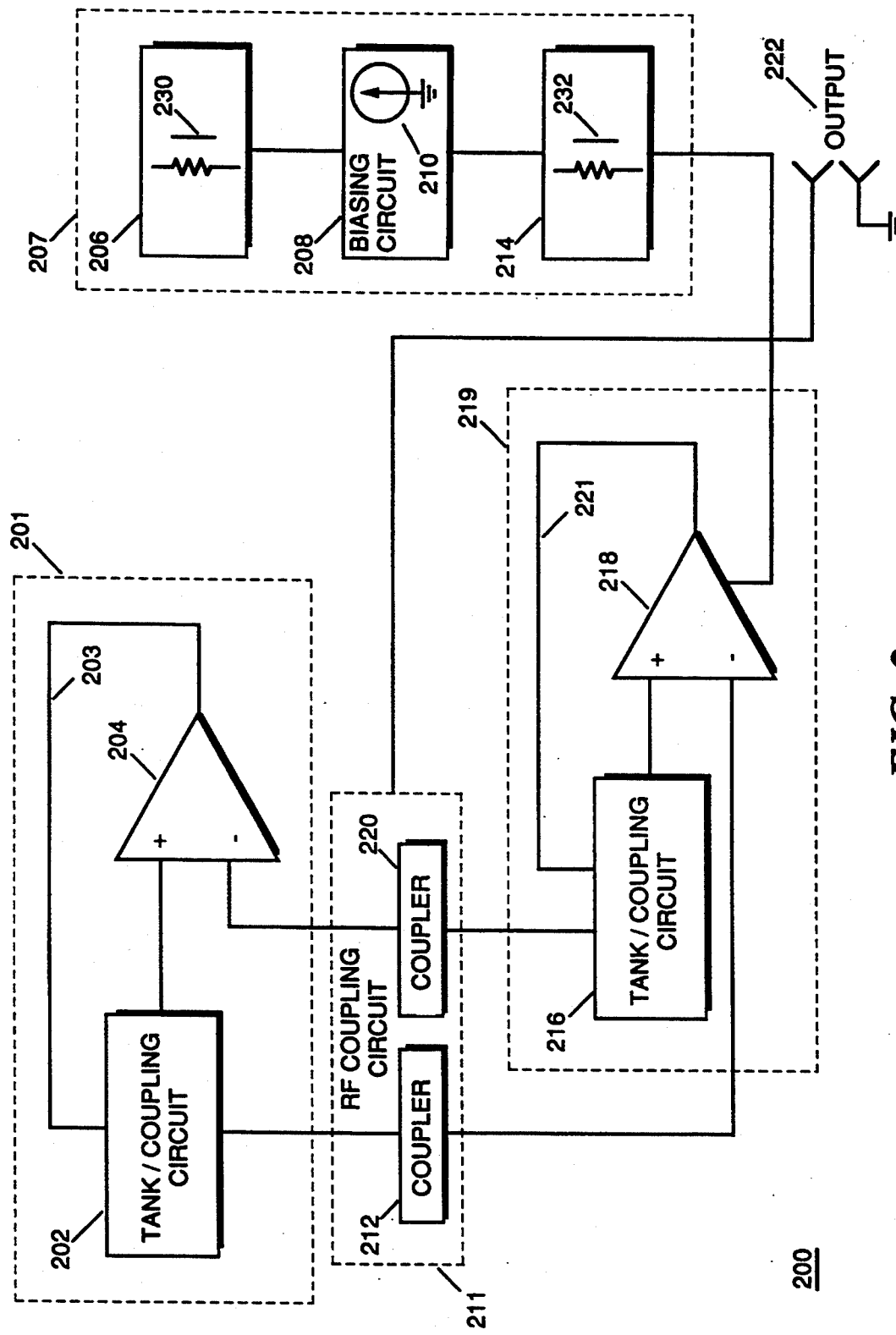
FIG. 2 shows a block diagram of a voltage controlled oscillator in accordance with the present invention.

Referring first to FIG. 2, a block diagram of a VCO in accordance with the present invention is shown. This VCO includes first and second oscillator blocks 201 and 219, respectively. The first oscillator 201 includes a tank/coupling circuit 202 which resonates at a fixed frequency. Coupled to the tank circuit 202 is an amplifier 204 having a gain. The output of the amplifier 204 is fed back via feedback line 203 to the tank/coupling circuit 202. The feedback 203 along with the components of the two circuits 202 and 204 provide for the oscillation of the oscillator 201 at a desired frequency. Similarly, the second oscillator 219 includes a tank/coupling circuit 216, and amplifier 218 and a feedback 221. Tank/coupling circuit 216 has a fixed resonant frequency different from that of 202. The resonant frequencies of tank circuits 202 and 216 provide the range of oscillation for the VCO 200. In other words, the resonant frequency of oscillators 201 and 219 set the upper and lower limits on the range of frequencies produced by the VCO 200. The two oscillators 201 and 219 are coupled to each other via a Radio Frequency (RF) coupling circuit 211. Included in this coupling circuit is a coupler 212 that couples the first frequency resonant circuit 202 to the amplifier 218. Similarly, the second frequency resonant circuit 216 is coupled to the amplifier 204 via a coupler 220. This RF coupling circuit 211 is coupled to the two oscillators 201 and 219 in such a way to produce the oscillating frequency of the VCO 200. A detailed description of the operation of the coupler 211 is presented in the Nyugen and Meyer article.

The VCO 200 also includes an adjustable biasing block 207 which includes first and second adjustable resistor means 206 and 214 coupled to each other via a biasing circuit 208. The biasing circuit 208 comprises the means for generating a plurality of DC currents having a fixed sum. In other words, the biasing circuit 208 controls the total bias current to the oscillators 201 and 219. The biasing circuit 208 is coupled to the first and second amplifier 204 and 218 via adjustable resistors 206 and 214, respectively. The first and second adjustable resistor means 206 and 214 provide the means for manipulating the plurality of DC currents between the first and second amplifier stages 204 and 218 in order to adjust the gains of the stages and, therefore, the operating frequency of the VCO 200. Tuning lines 230 and 232 couple external inputs to the circuit 200 for varying the resistance of 206 and 214. This resistance variation results in changes in the operating frequency of the VCO 200. The output of the VCO 200 may be coupled to the coupling circuit 211 and is shown by 222. This output port 222 provides the output signal having a desired frequency as set by the adjustable resistor means 206 and 214.

Figure 3:
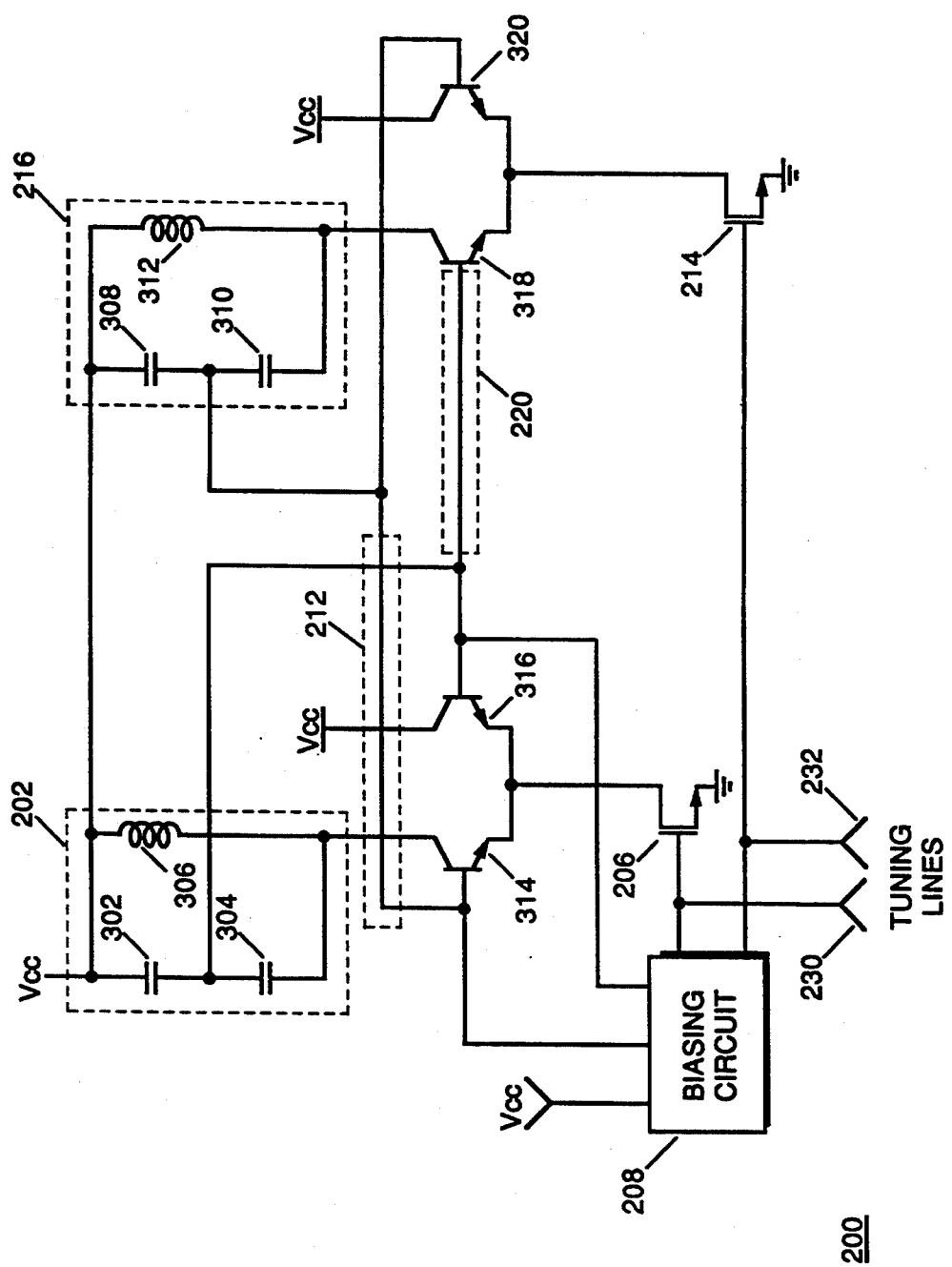
FIG. 3 shows a schematic diagram of a voltage controlled oscillator in accordance with the present invention.

Referring to FIG. 3 now, a schematic diagram of the various components of the VCO 200 is shown. The first tank/coupling circuit 202 includes an inductor 306 and two capacitors 302 and 304. These reactive components generate a first frequency which sets a first boundary for the operating frequency of the VCO 200. The second tank/coupling circuit 216 includes an inductor 312 and two capacitors 308 and 310. These reactive components generate the second frequency which sets a second boundary for the operating frequency of the VCO 200. Transistors 314 and 316 form the amplifying components of amplifier 204 and are coupled to the tank circuit 202 via connections from the base of transistors 316 and 318 to the junction of capacitors 302 and 304 and from the collector of transistor 314 to the junction of capacitor 304 and inductor 306. Similarly, transistors 318 and 320 provide the active components of the amplifier 218. The transistors are coupled to the tank 216 via connections from the base of transistor 320 to the junction of capacitors 308 and 310 and from the collector of transistor 318 to the junction of capacitor 310 and inductor 312. The biasing current for these transistor sets is provided by the biasing circuit 208 via Field Effect Transistors (FET) 206 and 214. These two transistors 214 and 216 which could be any FET such as JFET, MOSFET, or CMOS operate in the variable resistance mode. The sum of the current flowing through the two transistors 206 and 214 is maintained at a constant level by the biasing circuit 208. As an illustration, if the operating frequency of the tank circuit 202 is chosen to be F1 and that of the tank circuit 216 is chosen to be F2, the amplifiers and the variable resistors will allow the VCO 200 to have a frequency chosen between F1 and F2. As will be demonstrated later, this operation is accomplished at very low voltages such as 1.8 volt DC applied at the Vcc input. As can be seen the biasing circuit 208 is independently coupled to the DC voltage supply input (Vcc). In other words, a parallel scheme is observed in the way the biasing circuit 208 and the oscillators 201 and 219 are coupled to the voltage supply input.

Figure 4:
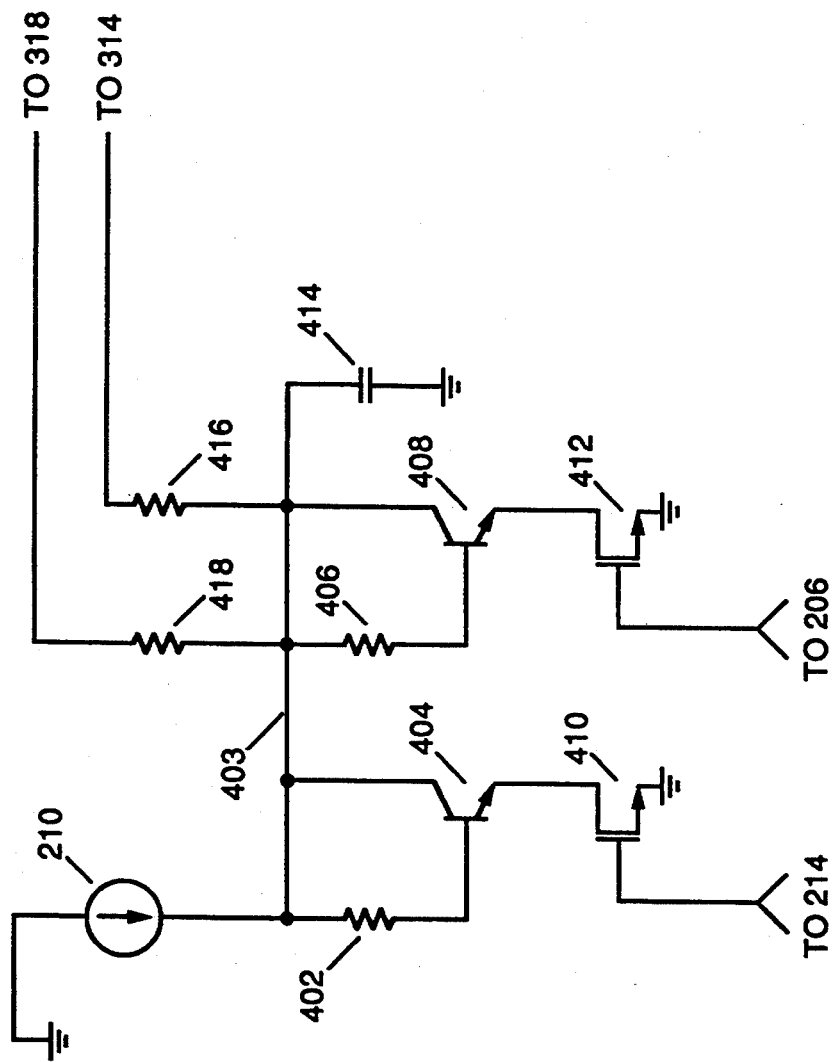
FIG. 4 shows a biasing circuit in accordance with the present invention.

Referring to FIG. 4, a schematic diagram of the components of the biasing circuit 208 in accordance with the present invention is shown. The biasing circuit 208 includes a current source 210 and a BIMOS (Bipolar-Metal Oxide Semiconductor) architecture including bipolar transistors 404 and 408 and FETs 4 10 and 412. The two transistors 404 and 408 are fabricated using the same process as that used in the fabrication of the transistors 314, 316, 318, and 320. The similarity of fabrication between 404, 408 and 314–320 insures substantially the same saturation current (I$_s$) and Beta for each device. This is important because these parameters must match to insure accurate mirroring of current between the bias devices 404 and 408 and the oscillator devices 314–320. The FETs 410 and 412 operate as adjustable resistors and are responsive to the tuning lines 230 and 232 which control the resistance of resistors 206 and 214. These two transistors are identical to transistors 206 and 214 except for a scaling factor. The resistors 418 and 416 provide the coupler means for coupling the transistors 404 and 408 to the bias voltage input of the amplifier stages 314, 316, 318, and 320.

Transistors 404, 408 and channel FETs 410 and 412 are connected to bipolar transistors 314–320 and FETs 206 and 214 to form a current mirror for low frequency currents applied by the current source 210. The sum of currents to transistors 314–320 is thus proportional to the current injected into the circuit by the current source 210. It is noted that the constant of proportionality is determined by the ratios of FET gate lengths and widths of devices 410,412 to FETs 206, 214 and by the ratios of emitter areas of Bipolar devices 404, 408 to devices 314–320.

A key feature of the VCO 200 is the insensitivity of the total bias current to changes in the tuning voltage 230 and 232. This function is achieved by utilizing devices 206, 214, and 314–320 in a current mirror arrangement with bias circuit device 404,408,410, and 412. In this arrangement bipolar device 404 and 408 form a mirror with 314–320. Triode operating FETs 206, 214, 410, and 412 provide emitter degeneration. The application of tuning voltages 230 and 232 to FETs 410 and 412 insures that the total emitter resistance provided by devices 404 and 408 is a scaled version of the emitter resistance seen by 314–320.

An important consideration is making the bias current insensitive to high frequency currents applied at the junction of the current source 210 and transistors 404 and 408. This is achieved through the use of resistors 416 and 418 and capacitor 414. These devices form a low pass filter to signals on the coupling lines 403. Resistors 402 and 406 are required to maintain the current mirror characteristics between oscillator devices 314–320 and bias devices 404 and 408 in the presence of resistors 402 and 406.

An analysis of the bias condition of the transistors 314–320 reveals the significant improvements achieved in the VCO 200. For typical bias conditions of 1.2 volts applied to the bases of these transistors through the biasing circuit 208, the steady state base-collector voltage on transistors 314–320 is $$V_{BC} = -0.6 \text{ volts}$$

Since for an onset of saturation the $$V_{BC} = +0.6 \text{ volts}$$

$$V_{CE} = +0.3 \text{ volts}$$

it can be seen that a change from steady state of 1.2 volt is possible in the VCO 200. This could occur, for example when tuning inputs 230 and 232 are set such that all bias current in the oscillator is directed through amplifier devices 314 and 316. Then no AC voltage is generated across tank circuit 216 causing the base of transistor 314 to be fixed at its quiescent value, i.e. 1.2 V. Saturation of transistor 314 could occur for a negative peak tank voltage of 1.2 V with respect to the supply voltage (Vcc). In the prior art, however, the maximum combined change at the collector of transistors 102 thorough 108 and bases of transistors 110 and 112 is 0.7 volt for a tuning voltage of 1.7 volts. Thus a 42% improvement is achieved.

Another problem resolved by the VCO 200 in accordance with the present invention is that of low tuning voltage range. This problem is solved through the use of triode-operating FETs 206 and 214 as tuning elements. For these devices gate voltage may vary at least between threshold and supply. For a threshold of 0.6 volts, the differential tuning voltage applied between the gates of transistors 206 and 214 may vary between (−1.2 V) and (+1.2 V), hence a 2.4 volt range. This is much larger than the 0.1 V available in the teachings of the prior art. Thus, the combination of the bipolar differential transistors 314, 316, 318 and 320 with the N-channel FETs provides a BiCMOS structure that overcomes the problems associated with the prior art.

It is understood that padding down of the signals applied to the tuning inputs 109 and 101 may be accomplished via resistive networks to effectively increase tuning range. A problem associated with such a technique is increased noise due to the added resistors. A second problem is the loading effect that such a resistive network will have on the tuning signal.

An improvement to the voltage swing of the tanks 202 and 216 may be accomplished by tapping inductors 306 and 3 12. Instead of coupling the collector of transistor 314 to the end of inductor 306, this collector may be tapped at some point on the inductor 306. Similarly, the collector of transistor 318 may be tapped at some point on the inductor 3 12. This tapping of the inductors provides for greater voltage swing on the inductors 306 and 312 without driving transistors 314–320 into saturation. This is achieved at the expense of oscillator loop gain. It is noted that even with the tapped resonator, the present invention has an advantage over the prior art in that it allows greater voltage swing at the collector of transistors 314 and 318 for a given inductor tap position. The greater voltage swing can result in an improved ratio of oscillator signal to noise.

Figure 5:
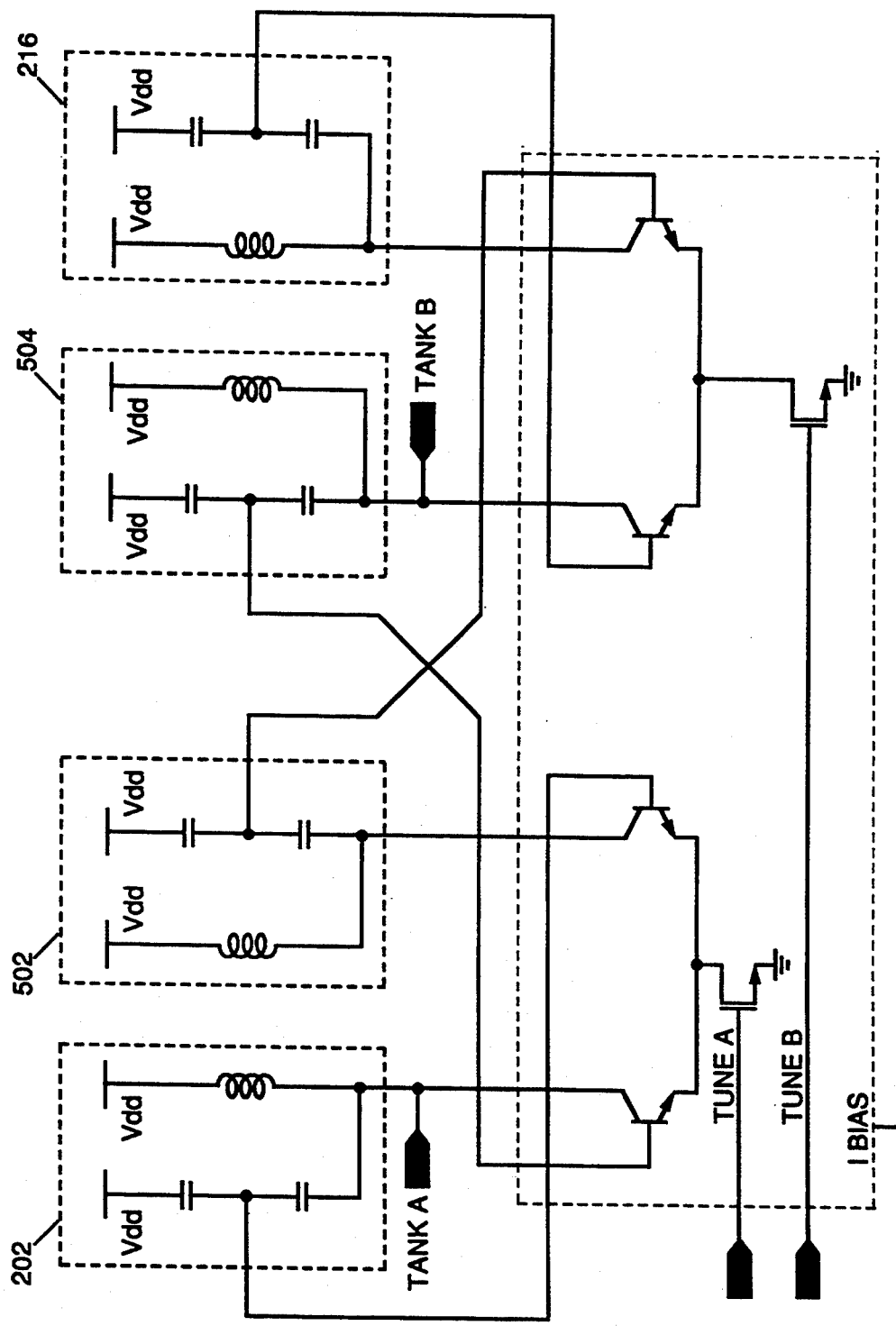
FIG. 5 shows an alternative embodiment of the present invention.

FIG. 5 shows a fully differential VCO 500 as an alternative embodiment of the present invention. The full differential operation of the VCO is accomplished by the addition of two tank circuits 502 and 504. Tank circuits 502 and 504 are identical to 202 and 216, respectively. This allows the tank circuits 202, 216, 502 and 504 to operate differentially and provide additional benefits. An advantage of this alternative embodiment 500 is that for a given bias current, sideband noise is reduced by 3db compared to the VCO 200.

Figure 6:
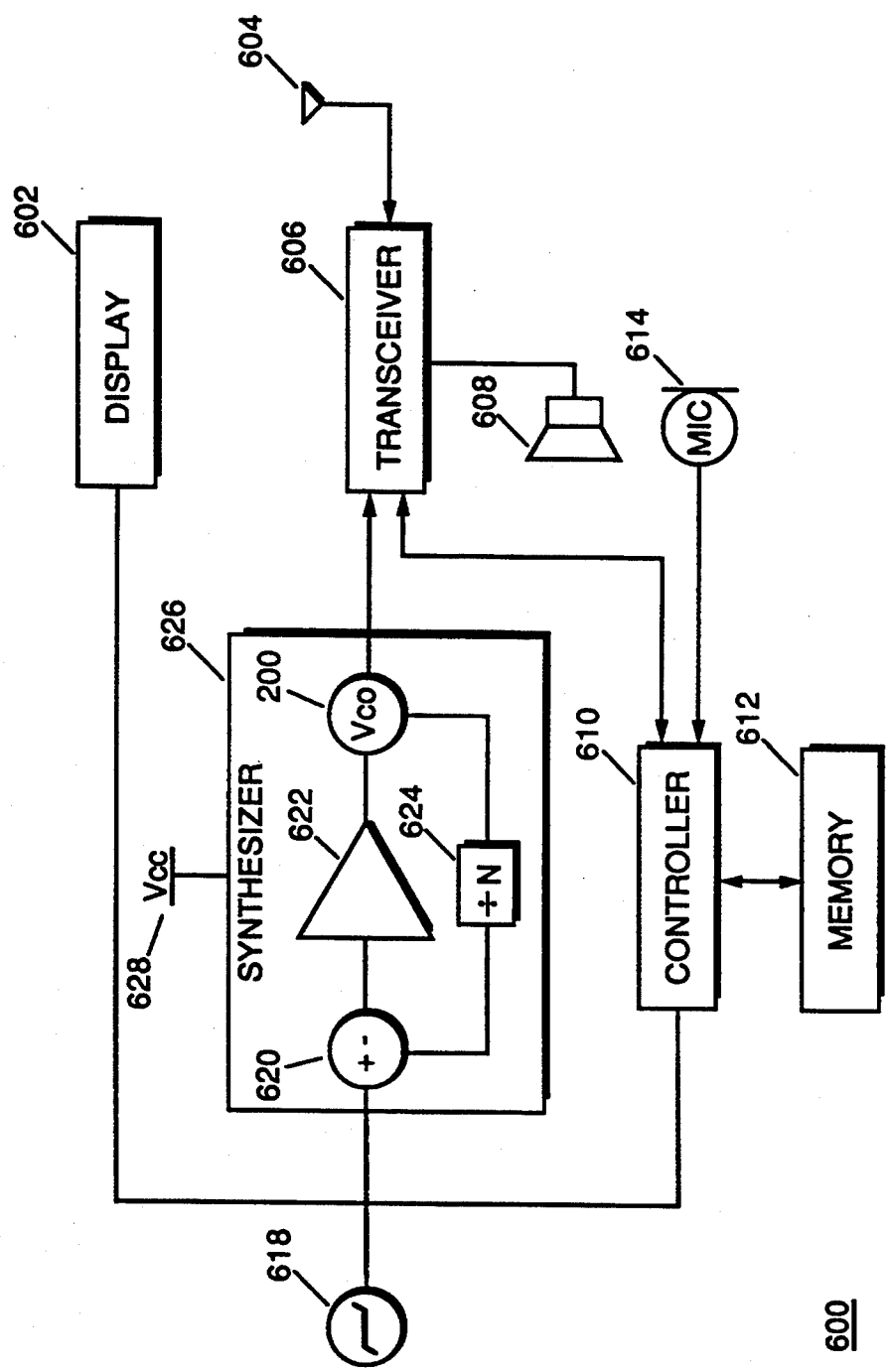
FIG. 6 shows a communication device in accordance with the present invention.

Referring now to FIG. 6., a block diagram of a communication device 600 is shown in accordance with the present invention. The communication device 600 includes an antenna 604 which is used to transmit and receive radio frequency signals. The antenna 604 is coupled to a transceiver 606 which processes receive and transmit signals. The transceiver 606 includes an antenna switch circuitry to selectively switch between transmit and receive mode. Coupled to the transceiver 606 is a synthesizer 626 which provides the local reference oscillator signal for the transceiver 606. The synthesizer 626 includes a phase detector 620, a filter 622, a divide-by-N 624 and the VCO 200. A clock 618 provides a reference signal to the PLL 626. The PLL 626 sets the VCO frequency to a chosen multiple of the frequency of the clock 618. The supply voltage for the synthesizer 626 is provided by Vcc 628 which could be as low as 1.8 VDC. The operation of the transceiver 606 is controlled via a controller 610 which also controls the operation of the synthesizer 626. Receive signals are processed and demodulated by the elements of the transceiver 606. Voice components of the receive signal are coupled to a speaker 608. Data components of the receive signal after being analyzed and decoded by the controller 610 are displayed on a display 602. A microphone 614 provides an information signal to the synthesizer 626 through the controller 610.

What is claimed is:

1. A low-voltage Voltage Controlled Oscillator (VCO), comprising:
a first oscillator having a first frequency of oscillation and a first bias current, comprising:
a first frequency resonant circuit;
a first amplifier stage having at least one transistor with a first gain, the first gain of the amplifier is adjusted via a first voltage;
a first feedback path coupled between the first frequency resonant circuit and the first amplifier stage to provide for oscillation;
a second oscillator having a second frequency of oscillation different from the first frequency and a second bias current, comprising:
a second frequency resonant circuit;
a second amplifier stage having at least one transistor with a second gain, the second gain is adjusted via a second voltage;
a second feedback path coupled between the second frequency resonant circuit and the second amplifier stage to provide for oscillation;
a Radio Frequency (RF) coupling circuit for coupling the first and second oscillators so as to produce the operating frequency of the VCO, comprising:
a first coupler for coupling the first frequency resonant circuit to the second amplifier stage;
a second coupler for coupling the second frequency resonant circuit to the first amplifier stage;
an adjustable biasing means, comprising:
means for generating a plurality of DC currents having a fixed sum, the means for generating is coupled to the first and second oscillators via degenerate resistors; and
means for manipulating the plurality of DC currents between the first and the second amplifier stages to adjust the operating frequency of the VCO.

2. The VCO of claim 1, wherein the means for manipulating includes adjustable resistors for setting biasing currents of the first and second oscillators via a (Direct Voltage) DC bias voltage.

3. The VCO of claim 2, wherein the adjustable resistors include Field Effect Transistors (FET).

4. The VCO of claim 2, wherein the means for generating a plurality of DC currents comprises:
a DC current source;
a plurality of transistors similar to the first and second amplifier transistors;
a plurality of adjustable resistors coupled to the plurality of transistors and responsive to the means for manipulating, the plurality of adjustable resistors are identical to the adjustable resistors of the means for manipulating; and
coupler means for coupling the plurality of transistors to the bias voltage inputs of the first and second amplifier stages.

5. The VCO of claim 1, wherein the first and second oscillators include tank circuits.

6. The VCO of claim 1, wherein the means for generating a plurality of DC currents includes a mixture of Bipolar and MOSFET (Metal Oxide Semiconductor FET) transistors.

7. A VCO adapted for operation with very low supply voltage, comprising:
   a DC voltage supply input;
   a first oscillator circuit having a first frequency resonant circuit for generating a first radio frequency signal, the first oscillator circuit is directly connected to the DC voltage supply input;
   a second oscillator circuit having a second frequency resonant circuit for generating a second radio frequency signal, the second oscillator circuit is directly connected to the DC voltage supply input;
   a first amplifier for amplifying the first radio frequency signal, the first amplifier is coupled to the DC voltage supply input through the first oscillator circuit;
   a second amplifier for amplifying the second radio frequency signal, the second amplifier is coupled to the DC voltage supply input through the second oscillator circuit;
   an adjustable biasing means comprising:
      a first adjustable resistor for setting bias current for the first oscillator circuit, the adjustable resistor circuit is coupled to the DC voltage supply input through the first amplifier;
      a second adjustable resistor for setting bias current for the second oscillator circuit, the adjustable resistor circuit is coupled to the DC voltage supply input through the second amplifier;
      means for generating a plurality of DC currents having a fixed sum, the means for generating is coupled to the DC voltage supply input in parallel with the first and second amplifiers so as to limit the drop of DC voltage available at the DC voltage supply input;
   a Radio Frequency (RF) coupling circuit for coupling the first and second oscillator circuits so as to produce the operating frequency of the VCO, comprising:
      a first coupler for coupling the first frequency resonant circuit to the second amplifier; and
      a second coupler for coupling the second frequency resonant circuit to the first amplifier.

8. The VCO of claim 7, wherein the means for generating a plurality of DC currents comprises:
   a DC current source;
   a plurality of transistors substantially identical to transistors in the first and second amplifiers;
   a plurality of adjustable resistors coupled to the plurality of transistors and responsive to the adjustable biasing means, the plurality of adjustable resistors are identical to the adjustable resistors of the adjustable biasing means; and
   coupler means for coupling the plurality of transistors to bias voltage input of the first and second amplifiers.

9. The VCO of claim 7, wherein the first and second oscillator circuits include tank circuits.

10. The VCO of claim 7, wherein the adjustable resistors include Field Effect Transistors (FET).

11. The VCO of claim 7, wherein the means for generating includes a mixture of Bipolar and MOSFET (Metal Oxide Semiconductor FET) transistors.

12. A communication device, comprising:
   a receiver for receiving a radio frequency signal, the receiver including a low voltage VCO, the VCO comprising:
      a DC voltage supply input;
      a first oscillator circuit for generating a first radio frequency signal, the first oscillator circuit is directly connected to the DC voltage supply input;
      a second oscillator circuit for generating a second radio frequency signal, the second oscillator circuit is directly connected to the DC voltage supply input;
      a first amplifier for amplifying the first radio frequency signal, the first amplifier is coupled to the DC voltage supply input through the first oscillator circuit;
      a second amplifier for amplifying the second radio frequency signal, the second amplifier is coupled to the DC voltage supply input through the second oscillator circuit;
      an adjustable biasing means comprising:
         a first adjustable resistor for setting bias current for the first oscillator circuit, the adjustable resistor circuit is coupled to the DC voltage supply input through the first amplifier;
         a second adjustable resistor for setting bias current for the second oscillator circuit, the adjustable resistor circuit is coupled to the DC voltage supply input through the second amplifier;
         means for generating a plurality of DC bias currents having a fixed sum, the means for generating is coupled to the DC voltage supply input in parallel with the first and second amplifiers so as to limit the drop of DC voltage available at the DC voltage supply input;
      a Radio Frequency (RF) coupling circuit for coupling the first and second oscillator circuits so as to produce the operating frequency of the VCO, comprising:
         a first coupler for coupling the first oscillator circuit to the second amplifier; and
         a second coupler for coupling the second oscillator circuit to the first amplifier.

13. The VCO of claim 12, wherein the means for generating a plurality of DC currents comprises:
   a DC current source;
   a plurality of transistors identical to transistors in the first and second amplifiers;
   a plurality of adjustable resistors coupled to the plurality of transistors and responsive to the adjustable biasing means, the plurality of adjustable resistors are identical to the adjustable resistors of the adjustable biasing means; and
   coupler means for coupling the plurality of transistors to bias voltage input of the first and second amplifiers.

14. The VCO of claim 12, wherein the first and second oscillator circuits include tank circuits.

15. The VCO of claim 12, wherein the adjustable resistors include Field Effect Transistors (FET).

16. The VCO of claim 12, wherein the means for generating includes a mixture of Bipolar and MOSFET (Metal Oxide Semiconductor FET) transistors.

* * * * *